United States Patent
Fuke et al.

(10) Patent No.: US 8,363,362 B2
(45) Date of Patent: Jan. 29, 2013

(54) MAGNETORESISTIVE ELEMENT

(75) Inventors: Hiromi Fuke, Yokohama (JP); Susumu Hashimoto, Tokyo (JP); Masayuki Takagishi, Kunitachi (JP); Hitoshi Iwasaki, Yokosuka (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/360,856

(22) Filed: Jan. 30, 2012

(65) Prior Publication Data

US 2012/0182647 A1 Jul. 19, 2012

Related U.S. Application Data

(63) Continuation of application No. PCT/JP2009/063682, filed on Jul. 31, 2009.

(51) Int. Cl.
*G11B 5/027* (2006.01)
(52) U.S. Cl. .............................................. 360/322
(58) Field of Classification Search .............. 360/322, 360/313, 125.33, 324.12, 319, 324.2
See application file for complete search history.

(56) References Cited

U.S. PATENT DOCUMENTS

| | | | |
|---|---|---|---|
| 6,937,447 B2 | 8/2005 | Okuno et al. | |
| 7,218,484 B2 | 5/2007 | Hashimoto et al. | |
| 7,240,419 B2 | 7/2007 | Okuno et al. | |
| 7,265,950 B2 | 9/2007 | Okuno et al. | |
| 7,355,883 B2 | 4/2008 | Okuno et al. | |
| 7,494,724 B2 | 2/2009 | Okuno et al. | |
| 7,525,772 B2 * | 4/2009 | Koui et al. | 360/324.1 |
| 7,872,838 B2 | 1/2011 | Zhang et al. | |
| 2006/0209472 A1* | 9/2006 | Koui et al. | 360/324.1 |
| 2007/0259213 A1 | 11/2007 | Hashimoto et al. | |
| 2008/0080098 A1 | 4/2008 | Fuke et al. | |
| 2008/0102315 A1 | 5/2008 | Fukuzawa et al. | |
| 2008/0239591 A1 | 10/2008 | Fuji et al. | |

FOREIGN PATENT DOCUMENTS

| | | |
|---|---|---|
| JP | 2005-109242 A | 4/2005 |
| JP | 2005-191101 A | 7/2005 |
| JP | 2005-285936 A | 10/2005 |
| JP | 2006-041266 A | 2/2006 |
| JP | 2008-021749 A | 1/2008 |

OTHER PUBLICATIONS

International Search Report dated Oct. 27, 2009 from PCT/JP2009/063682.

Garcia, et al.; "Magnetoresistance in Excess of 200% in Ballistic Ni Nanocontacts at Room Tempreature and 100 Oe"; Physical Review Letters, vol. 82, No. 14, Apr. 5, 1999, pp. 2923-2926.

* cited by examiner

*Primary Examiner* — Allen Cao
(74) *Attorney, Agent, or Firm* — Ohlandt, Greeley, Ruggiero & Perle, L.L.P.

(57) ABSTRACT

According to one embodiment, a magnetoresistive element includes a first ferromagnetic layer a magnetization direction of which is pinned, a second ferromagnetic layer a magnetization direction of which is changed depending on an external magnetic field, an intermediate layer arranged between the first ferromagnetic layer and the second ferromagnetic layer and including an insulating layer and a magnetic conductive column, an alloy layer formed between the magnetic conductive column in the intermediate layer and the second ferromagnetic layer and including at least one of FeCoAl and FeCoAlCu, and a pair of electrodes configured to supply a current perpendicularly to a film plane of a stacked film including the first ferromagnetic layer, the intermediate layer, the alloy layer and the second ferromagnetic layer.

9 Claims, 7 Drawing Sheets

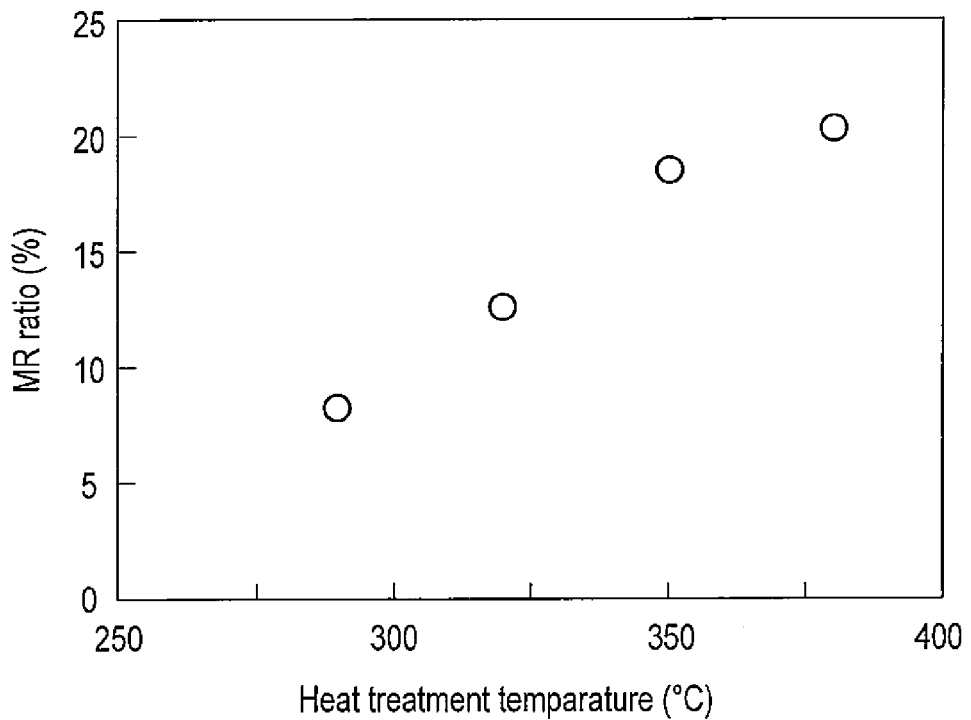
F I G. 3
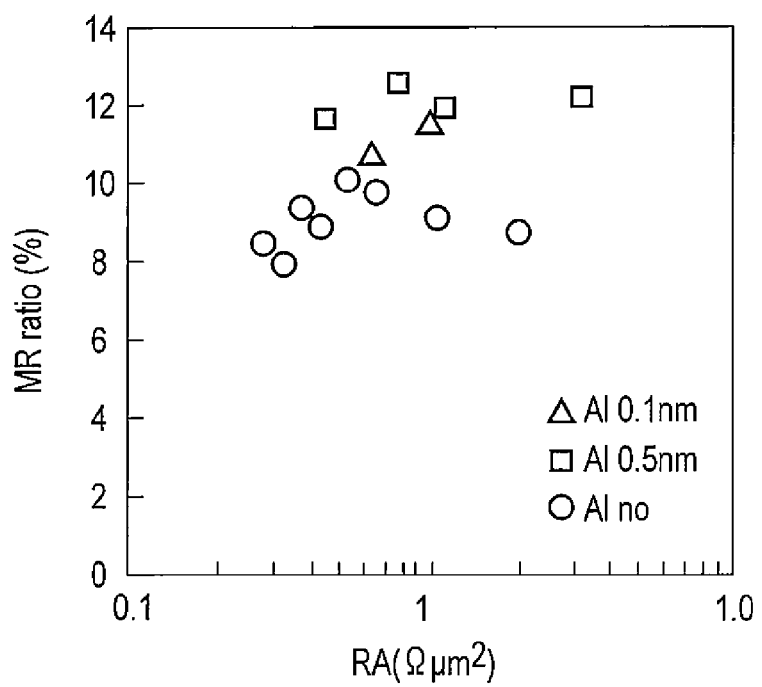
F I G. 4

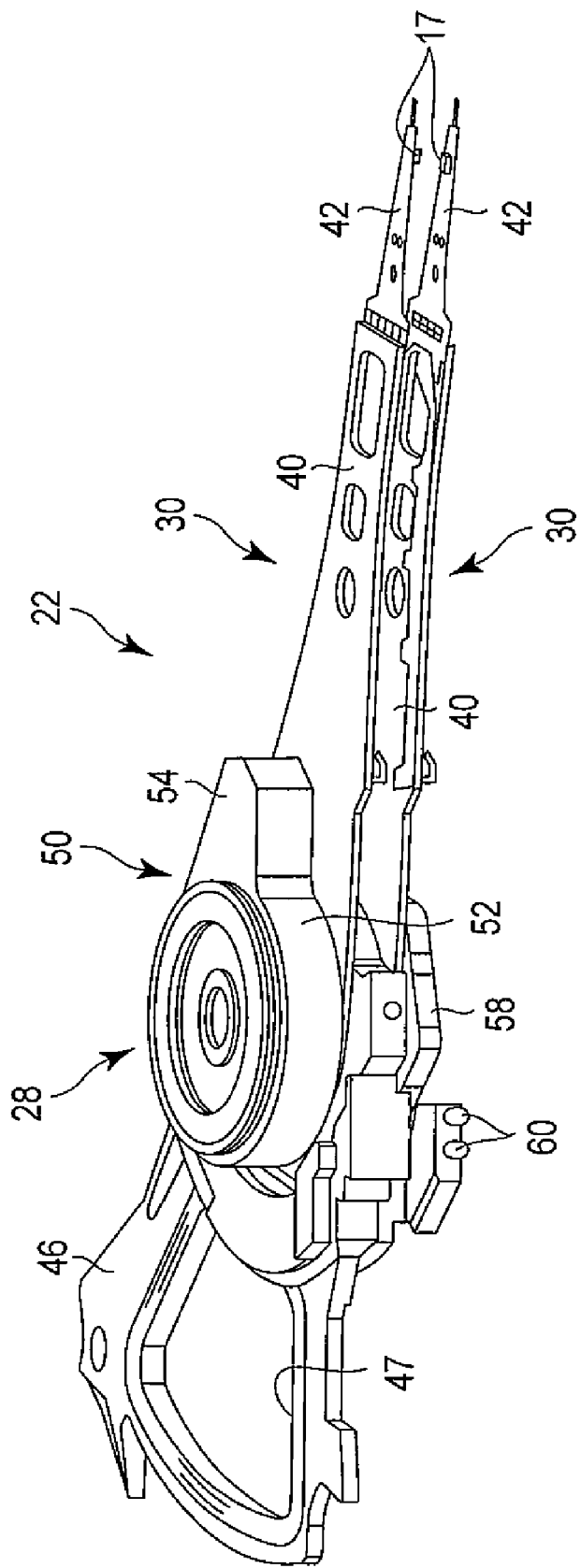
F I G. 8

MAGNETORESISTIVE ELEMENT

CROSS REFERENCE TO RELATED APPLICATIONS

This application is a Continuation Application of PCT Application No. PCT/JP2009/063682, filed Jul. 31, 2009, the entire contents of which are incorporated herein by reference.

FIELD

Embodiments described herein relate generally to a magnetoresistive element.

BACKGROUND

With respect to spin-valve films that are applied to magnetic devices such as magnetic heads and MRAMs (magnetic random access memories), TMR (tunneling magnetoresistance) elements and CPP (current-perpendicular-to-plane)-GMR (giant magnetoresistance) elements, in which a sense current is supplied in a direction approximately perpendicularly to a film plane, are paid attentions since they can exhibit a large MR.

On the other hand, in recent years, it has been observed that a magnetoresistance effect with a high magnetoresistance change rate can be resultant by using a nanocontact between Ni thin wires. See Phys. Rev. Lett. 82 2923 (1999).

Furthermore, development of a magnetoresistive element in which a magnetic nanocontact is extended to a three-dimensional structure is in progress. See JP-A 2003-204095 (KOKAI).

The magnetoresistance effects described in the above-mentioned documents are exserted in relation to that twisting of magnetization, i.e., a magnetic wall is generated in a magnetic nanocontact when the magnetization directions of a pinned layer and a free layer are in antiparallel. It is considered that this magnetoresistance effect increases more as the magnetization in the magnetic nanocontact changes more rapidly, i.e., as the thickness of the magnetic wall (magnetic wall width) that is generated in the magnetic nanocontact is narrower. In addition, since a magnetic wall width depends on the diameter of the magnetic nanocontact, a smaller diameter of the magnetic nanocontact is preferable. Furthermore, it is desirable that the purity of a magnetic metal in the magnetic nanocontact, i.e., magnetic wall, is high.

However, it is very difficult to form a magnetic nanocontact having a small diameter and comprising a magnetic metal at a high purity. Furthermore, since the magnetic nanocontact is formed of a ferromagnetic metal, there is a fear that a interlayer coupling field between the pinned layer and the free layer increases, thereby an operation point as a read head shifts toward a higher magnetic field.

BRIEF DESCRIPTION OF THE DRAWINGS

FIG. 3 is a graph showing the relationship between the heat treatment temperature and MR ratio in Example 1;

FIG. 4 is a graph showing the relationship between the resistance area product and MR ratio in Example 2;

FIG. 8 is a perspective view showing the head stack assembly in the HDD in FIG. 7.

DETAILED DESCRIPTION

Figure 1A:
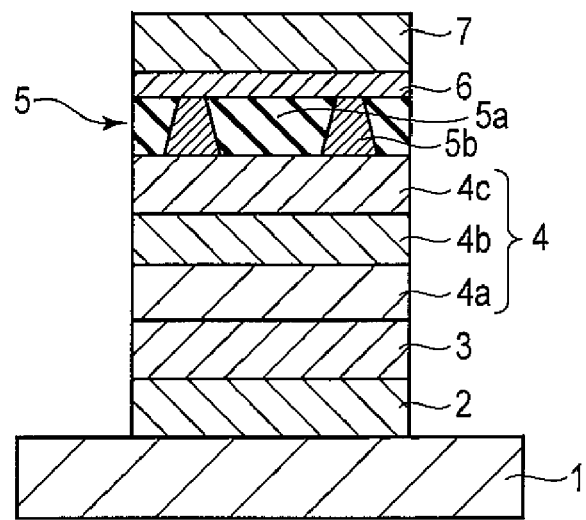
FIGS. 1A and 1B are cross-sectional views each showing a magnetoresistive element according to an embodiment.

In general, according to one embodiment, a magnetoresistive element includes a first ferromagnetic layer a magnetization direction of which is pinned, a second ferromagnetic layer a magnetization direction of which is changed depending on an external magnetic field, an intermediate layer arranged between the first ferromagnetic layer and the second ferromagnetic layer and including an insulating layer and a magnetic conductive column, an alloy layer formed between the magnetic conductive column in the intermediate layer and the second ferromagnetic layer and comprising at least one of FeCoAl and FeCoAlCu, and a pair of electrodes configured to supply a current perpendicularly to a film plane of a stacked film including the first ferromagnetic layer, the intermediate layer, the alloy layer and the second ferromagnetic layer.

Hereinafter, embodiments are described referring to the drawings.

Figure 1B:
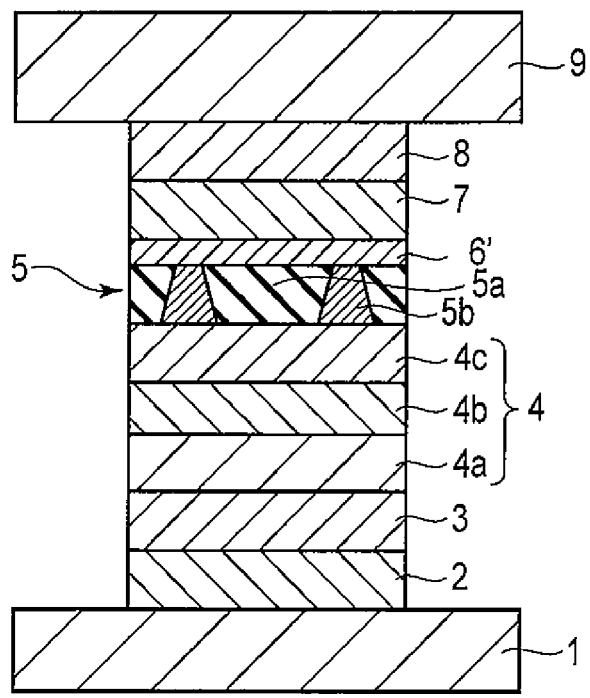
Figure 2A:
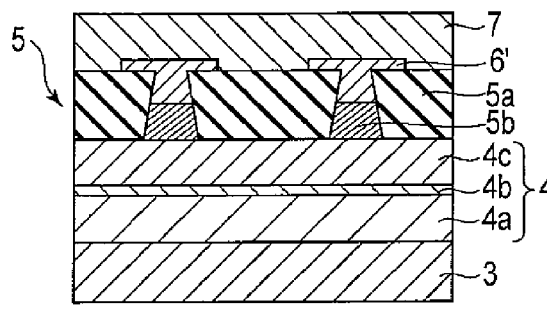
FIGS. 2A to 2F are cross-sectional views each showing an geometry of an alloy layer of the magnetoresistive element according to an embodiment.
Figure 2D:
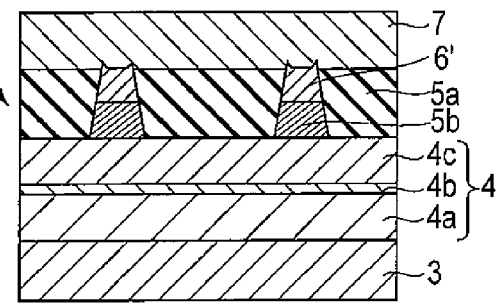
Figure 2B:
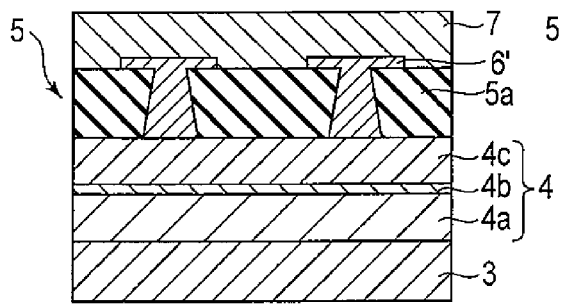
Figure 2E:
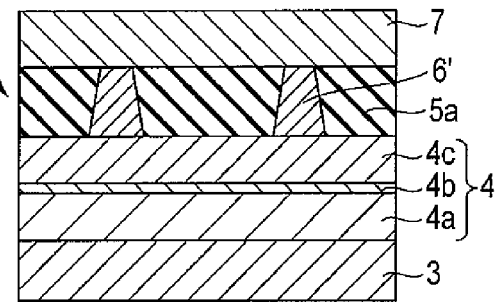
Figure 2C:
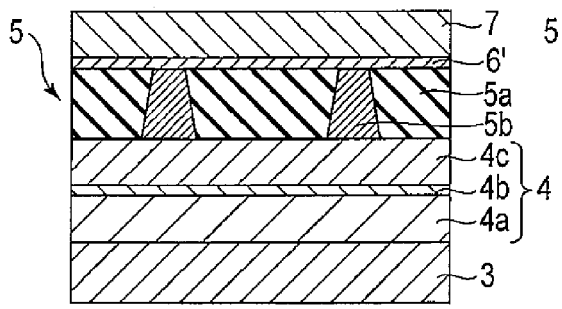
Figure 2F:
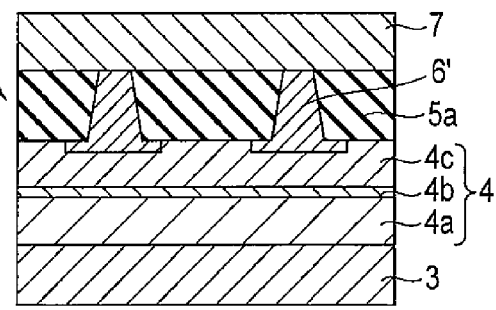

FIG. 1A is a cross-sectional view showing the state during the production of the magnetoresistive element of an embodiment. FIG. 1B is a cross-sectional view showing the magnetoresistive element of an embodiment.

In FIG. 1A, on a lower electrode (LE) 1, an underlayer 2, a magnetization pinning layer 3 formed of an antiferromagnetic material, a first ferromagnetic layer a magnetization direction of which is pinned (hereinafter referred to as a pinned layer) 4, an intermediate layer 5, a metal layer 6 that is to be converted to an alloy layer, and a second ferromagnetic layer 7 a magnetization direction of which is changed according to an external magnetic field (hereinafter referred to as a free layer) are stacked.

In the magnetoresistive element of FIG. 1B, the metal layer 6 is converted to an alloy layer 6' by performing a heat treatment. Furthermore, a protective layer 8 and an upper electrode (UE) 9 are stacked on the free layer 7.

In FIG. 1B, a spin-valve film is constituted by the pinned layer 4, intermediate layer 5 and free layer 7. In this magnetoresistive element, a sense current is supplied perpendicularly to the film plane of the stacked film between the lower electrode (LE) 1 and upper electrode (UE) 9 through the both electrodes.

The pinned layer 4 in FIGS. 1A and 1B has a synthetic structure comprising a lower pinned layer 4a and an upper pinned layer 4c sandwiching a magnetization coupling layer 4b.

The intermediate layer 5 in FIGS. 1A and 1B comprises an insulating layer 5a and magnetic conductive columns 5b that penetrate through the insulating layer 5a in the film thickness direction. The magnetic conductive columns 5b comprise at least a part of the constituent elements of the upper pinned layer 4c of the primer.

Although the magnetoresistive element of FIG. 1B has a bottom structure in which the pinned layer 4 is positioned on the bottom, but may have a top structure in which the pinned layer 4 is positioned on the top. In the case of the top structure, the stacked film of FIG. 1A is inverted, and the underlayer 2, the free layer 7, the metal layer 6 that is to be converted to an alloy layer, the intermediate layer 5, the pinned layer 4, the magnetization pinning layer 3 and the protective layer 8 are stacked in this order from the lower electrode (LE).

Hereinafter, each layer shown in FIGS. 1A and 1B is described in more detail.

The lower electrode (LE) 1 is an electrode for supplying a sense current perpendicularly to the film plane of the stacked film between the lower electrode (LE) 1 and upper electrode (UE) 9.

The underlayer 2 can be, for example, a two-layer structure comprising a buffer layer and a seed layer. The buffer layer is a layer for alleviating the roughness of the surface of the lower electrode (LE) 1, and is formed of Ta, Ti, W, Zr, Hf, Cr, or an alloy thereof. The seed layer is a layer for controlling the crystal orientation of the spin-valve film, and is formed of Ru, $(Fe_xNi_{100-x})_{100-y}X_y$, (X=Cr, V, Nb, Hf, Zr, Mo, 15<x<25, 20<y<45), Cr, Cu or the like. It should be noted that the underlayer 2 may be formed of only one of the buffer layer and underlayer.

The magnetization pinning layer 3 has a function of imparting unidirectional anisotropy to the pinned layer 4 to pin magnetization. The antiferromagnetic material in the magnetization pinning layer 3 includes, for example, PtMn, PdPtMn, IrMn, RuRhMn. When IrMn is used for the magnetization pinning layer 3, it is preferable to adjust the Ir composition to more than 22 at % in view of heat resistance.

The magnetization direction of the pinned layer 4 is pinned by the magnetization pinning layer 3. The lower pinned layer 4a and upper pinned layer 4c included in the pinned layer 4 are formed of a magnetic material such as Fe, Co, Ni, a FeCo alloy, a FeNi alloy, a FeCoNi alloy, a CoFeB alloy and a Heusler alloy (a $Co_2MnAi$ alloy, a $Co_2MnGe$ alloy, a $Co_2MnSn$ alloy, a $Co_2MnGa$ alloy, a $Co_2FeAl$ alloy, a $Co_2FeSi$ alloy and a $Co_2MnAl$ alloy). The magnetization coupling layer 4b antiferromagnetically couples the magnetizations of the lower pinned layer 4a and upper pinned layer 4c. The magnetization coupling layer 4b is formed of, for example, Ru, Ir and Rh. Although the pinned layer 4 has a synthetic structure in FIG. 1B, the pinned layer 4 may also be formed of a monolayer ferromagnetic layer.

The insulating layer 5a in the intermediate layer 5 is formed of an oxide, a nitride, a carbide comprising at least one of Al, Mg, Li, Si, Ca, Sc, Ti, V, Cr, Mn, Fe, Co, Ni, Cu, Zn, Ga, Se, Sr, Y, Zr, Nb, Mo, Pd, Ag, Cd, In, Sn, Sb, Ba, K, Hf, Ta, W, Re, Pt, Hg, Pb, Bi and lanthanoid elements. In the intermediate layer 5, the above-mentioned element does not have to be completely converted to an oxide, a nitride, or a carbide.

The magnetic conductive column 5b in the intermediate layer 5 functions as a magnetic nanocontact and also functions as a path for supplying a current perpendicularly to the film plane of the intermediate layer 5. The magnetic conductive column 5b before a heat treatment is formed of a ferromagnetic material comprising at least one selected from the group consisting of Fe, Co, Ni that are constituent elements for the upper pinned layer 4c in the pinned layer 4.

The metal layer 6 that is to be converted to the alloy layer is formed of a material comprising at least one element selected from the group consisting of Al, Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, and Hf.

The magnetization direction of the free layer 7 is changed according to an external magnetic field. The free layer 7 is formed of a magnetic material such as Fe, Co, Ni, a FeCo alloy, a FeNi alloy, a FeCoNi alloy, a CoFeB alloy and a Heusler alloy (a $Co_2MnAi$ alloy, a $Co_2MnGe$ alloy, a $Co_2MnSn$ alloy, a $Co_2MnGa$ alloy, a $Co_2FeAl$ alloy, a $Co_2FeSi$ alloy and a $Co_2MnAl$ alloy). It is also possible to adjust the composition by inserting a non-magnetic metal layer to the above-mentioned magnetic material. While the free layer 7 is formed into a ferromagnetic layer of a single layer in FIGS. 1A and 1B, a ferromagnetic stacked structure may be used for the purpose of obtaining soft magnetic property.

The protective layer 8 has a function to protect the spin-valve film. The protective layer 8 may be a single layer film, a multilayer film or a mixture of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Pt, Ni, Co, Re, V, or a stacked film thereof. For example, a two-layer structure of Cu/Ru and a three-layer structure of Cu/Ta/Ru, and the like can be used.

The upper electrode (UE) 9 is an electrode for supplying a sense current perpendicularly to the film plane of the stacked film between the lower electrode (LE) 1 and upper electrode (UE) 9.

Next, the method of manufacturing the magnetoresistive element shown in FIG. 1B is described briefly.

For example, the lower electrode (LE) 1, the underlayer 2, the magnetization pinning layer 3 and the pinned layer 4 are deposited on a substrate. A metal layer is deposited on the pinned layer 4, and the intermediate layer 5 comprising an insulating layer comprising an oxide layer, nitride layer or carbide layer that is formed by oxidization, nitridation or carbonization of the metal layer and a magnetic conductive column that intrudes in the film thickness direction of the insulating layer is formed. The metal layer 6 comprising at least one selected from Al, Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, and Hf, which is to be converted to an alloy layer, and the free layer 7 are deposited on the intermediate layer 5, and the layers are subjected to a heat treatment to form the alloy layer 6'. Then, the protective layer 8 and the upper electrode (UE) 9 are formed in this order.

Alternatively, the lower electrode (LE) 1, underlayer 2, magnetization pinning layer 3 and pinned layer 4 are deposited on the substrate in a similar manner as mentioned above, and the intermediate layer 5 is then formed. The metal layer 6 comprising at least one selected from Al, Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, and Hf, which is to be converted to an alloy layer, the free layer 7 and the protective layer 8 are deposited on the intermediate layer 5, and the layers are subjected to a heat treatment to form the alloy layer 6'. Then, the upper electrode (UE) 9 is formed.

By the methods as mentioned above, the alloy layer 6' comprising a magnetic element and at least one element selected from the group consisting of Al, Cu, Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, and Hf is formed. As mentioned below, the metal layer 6 that is to be converted to the alloy layer has an effect of improving purity of the magnetic metal in the magnetic conductive column 5b in the intermediate layer 5, and when it is converted to the alloy layer 6', an oxide, nitride or carbide comprising the element of the metal layer 6 are also formed as by-products.

Furthermore, after formation of the upper electrode (UE) 9, a heat treatment (pin annealing) at around 300° C. for imparting unidirectional anisotropicity to the pinned layer 4 is conducted. If the heat treatment for forming the alloy layer 6' is around 300° C., it can be conducted after forming the upper electrode (UE) 9. Generally, the deposition of each layer and heat treatment are conducted under reduced pressure.

Hereinafter, a method of manufacturing a magnetoresistive element according to an embodiment is specifically described.

(1) Formation of Lower Electrode (LE) 1, Underlayer 2 and Magnetization Pinning Layer 3

A lower electrode (LE) 1 is formed on a substrate (not depicted) by a microfabrication process. An underlayer 2 and a magnetization pinning layer 3 are deposited in this order on the lower electrode (LE) 1.

(2) Formation of Pinned Layer 4 having Synthetic Structure

A lower pinned layer 4a, a magnetization coupling layer 4b and an upper pinned layer 4c are deposited in this order.

(3) Formation of Intermediate Layer 5

A metal layer that is to be converted to an insulating layer composed of an oxide layer, nitride layer or carbide layer is formed on the upper pinned layer 4c of the pinned layer 4. Here, the case where Al is deposited and then converted to an oxide layer is described as an example.

An Al film is deposited on the upper pinned layer 4c. The Al film is oxidized by a natural exposing process, an ion assist process, an RF plasma process, an ion beam process, a radical process or the like to form an insulating layer 5a composed of an Al oxide. Furthermore, the formed insulating layer 5a is irradiated with RF plasma or ion beam of a rare gas, and at least a part of the constituent elements of the upper pinned layer 4c is invaded in the film thickness direction of the insulating layer 5a to form a magnetic conductive column 5b. By this way, the intermediate layer 5 is formed.

(4) Formation of Metal Layer 6

A metal layer 6 comprising at least one element selected from the group consisting of Al, Cu, Cr, V, Ta, Nb, Sc, Ti, Mn, Zn, Ga, Ge, Zr, X, Tc, Re, B, In, C, Si, Sn, Ca, Sr, Ba, Au, Ag, Pd, Pt, Ir, Rh, Ru, Os, and Hf is deposited on the intermediate layer 5 comprising the insulating layer 5a and the magnetic conductive column 5b. The metal layer 6 will be converted to an alloy layer 6' in the next step. Here, the case where an Al film or a stacked film of Al/Cu is deposited as the metal layer 6 is described. The metal layer 6 may be an alloy layer of two or more types of metals such as an AlCu alloy.

(5) Formation of Free Layer 7, and Formation of Alloy Layer 6'

A free layer 7 is deposited on the metal layer 6. After deposition of the free layer 7, a heat treatment is conducted in vacuum at a temperature higher than the temperature during deposition, thereby the metal layer 6 is converted to an alloy layer 6'. The heat treatment temperature may be a temperature at which diffusion of atoms occurs, and is preferably from 200 to 450° C. When the heat treatment is conducted, the constituent elements of the metal layer 6 absorb impurities in the magnetic conductive column 5b, and further form an alloy with the magnetic element in the magnetic conductive column 5b and free layer to form the alloy layer 6' comprising the magnetic element and Al, or Al and Cu. At this time, an oxide, nitride or carbide comprising at least one element of the metal layer 6 is also formed as a by-product. As a result, the purity of the magnetic metal in the magnetic conductive column 5b is improved. For example, in the case where a $Fe_{50}Co_{50}$ alloy is used for the free layer 7 and an Al film is used for the metal layer 6, a ternary alloy layer 6' of FeCoAl is formed. Furthermore, in the case where a $Fe_{50}Co_{50}$ alloy is used for the free layer 7 and an Al/Cu stacked film or an AlCu alloy layer is used for the metal layer, a quaternary alloy layer 6' of FeCoAlCu is formed.

The examples of geometries of the alloy layers 6' as formed are shown in FIGS. 2A to 2F.

The alloy layers 6' in FIGS. 2A to 2F are formed as mentioned above. The oxide, nitride or carbide formed as a by-product is in a trace amount as compared to the alloy layer 6', and thus geometries thereof cannot be specified.

(6) Formation of Protective Layer 7 and Upper Electrode (UE) 8

A protective layer 7 and an upper electrode (UE) 8 are formed in this order on the free layer 6 to manufacture a magnetoresistive element. A heat treatment for forming the alloy layer 6' may be conducted after formation of the protective layer 7. If the heat treatment temperature for forming the alloy layer 6' is around 300° C., the heat treatment can be conducted after forming the upper electrode (UE) 8. The latter heat treatment can be conducted simultaneously with the heat treatment in a magnetic field described below, which is for imparting unidirectional anisotropicity to the pinned layer 4.

(7) Heat Treatment in Magnetic Field

The magnetization direction of the pinned layer 4 is pinned by heat-treating the resultant magnetoresistive element in a magnetic field. Meanwhile, in the case where the heat treatment for forming the alloy layer 6' is conducted in a magnetic field, this heat treatment in a magnetic field is not always needed to be conducted. On the other hand, a heat treatment for ordering a Heusler alloy is separately conducted in some cases.

EXAMPLES

Example 1

In this example, a magnetoresistive element was manufactured as follows.

First, the layers from an underlayer 2 to a metal layer to be converted to an insulating layer 5b of an intermediate layer 5 were formed on a lower electrode (LE) 1 by using the following materials, respectively.

Underlayer 2: Ta [5 nm]/Ru [2 nm]
Magnetization pinning layer 3: IrMn [7 nm]
Lower pinned layer 4a: $Co_{90}Fe_{10}$ [3.3 nm]
Magnetization coupling layer 4b: Ru [0.9 nm]
Upper pinned layer 4c: $Fe_{50}Co_{50}$ [2.5 nm]
Metal layer to be converted into insulating layer 5a: Al [0.9 nm]

After depositing Al, the Al film was irradiated with Ar ion while oxygen was introduced in a chamber at room temperature. After introduction of oxygen was stopped, the Al film was irradiated continuously with Ar ion. By this way, the intermediate layer 5 having the insulating layer 5a and the magnetic conductive column 5b comprising at least a part of the constituent elements of the upper pinned layer 4c that was invaded in the film thickness direction of the insulating layer 5a was formed.

An Al film of the metal layer 6 to be converted to an alloy layer 6' was deposited in a thickness of 0.5 nm on the intermediate layer 5. A free layer 7 composed of $Fe_{50}Co_{50}$ was deposited in a thickness of 2.5 nm on the Al film of the metal layer 6. Then, the layers were heated at 290 to 380° C. for 30 minutes in vacuum. By this heat treatment, the alloy layer 6' comprising magnetic elements and Al was formed.

Furthermore, Cu [1 nm]/Ta [2 nm]/Ru [15 nm] was formed as a protective layer 8, and an upper electrode (UE) 9 was then formed to produce a magnetoresistive element.

The resultant magnetoresistive element was heat-treated at 290° C. for one hour, thereby unidirectional anisotropy was imparted to the pinned layer.

FIG. 3 shows the relationship between the heat treatment temperature for converting the metal layer 6 on the intermediate layer 5 to the alloy layer 6' and the MR ratio of the resultant magnetoresistive element. As shown in FIG. 3, the MR ratio was improved in accordance with the rise of the heat treatment temperature.

Example 2

The thickness of an Al film of a metal layer 6 deposited on a intermediate layer 5 and to be converted to an alloy layer 6' was adjusted to 0.5 nm, 0.1 nm or 0 nm (a film was not deposited), and the temperature for the heat treatment for converting the Al metal layer 6 to the alloy layer 6' was adjusted to 380° C. Except that, a magnetoresistive element was produced in a similar manner to that of Example 1.

Figure 5:
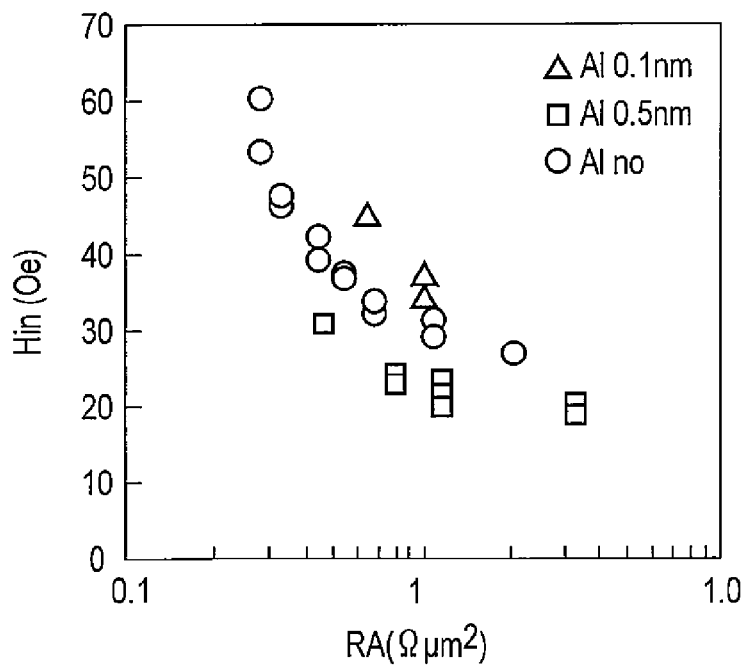
FIG. 5 is a graph showing the relationship between the resistance area product and interlayer coupling field in Example 2.

FIG. 4 shows the relationship between the resistance area product RA and MR ratio of the resultant magnetoresistive element. FIG. 5 shows the relationship between the resistance area product RA and interlayer coupling field Hin of the resultant magnetoresistive element.

As shown in FIG. 4, the thicker the thickness of the Al film of the metal layer 6 is, the higher the MR ratio is in the above-mentioned range.

From FIG. 5, the following can be seen. From comparison between the case where the Al metal layer 6 was not deposited and the case where the Al metal layer 6 having a thickness of 0.1 nm was deposited, the interlayer coupling field Hin is slightly higher in the case where the Al film having a thickness of 0.1 nm was deposited. In contrast to this, from comparison between the case where the Al metal layer 6 was not deposited and the case where the Al metal layer 6 having a thickness of 0.5 nm was deposited, the interlayer coupling field Hin is lower in the case where the Al metal layer 6 having a thickness of 0.5 nm was deposited.

Here, the thickness of the metal layer 6 deposited on the intermediate layer 5 and to be converted to the alloy layer 6' is preferably 0.3 to 5 nm. When the thickness of the metal layer 6 is less than 0.3 nm, it is difficult to reduce the interlayer coupling field. Furthermore, when the thickness of the metal layer exceeds 5 nm, the elements in the metal layer 6 is mixed with the constituent elements of the antiferromagnetic film during the heat treatment to deteriorate the pinning property in some cases.

Example 3

An Al film to be converted to an insulating layer 5a having a thickness of 0.9 nm was deposited on an upper pinned layer 4c, and an intermediate layer 5 was formed by formation of the insulating layer 5a by an oxidizing treatment and formation of conductive columns 5b by irradiation of ion beam. Next, an Al metal layer 6 having a thickness of 0.4 nm to be converted to an alloy layer 6' was deposited on the intermediate layer 5, and a free layer 7 was deposited. After completion of the deposition, a heat treatment at 380° C. for 1 hour was conducted. Except that, a magnetoresistive element (Example 3) was manufactured in a similar manner to that of Example 1.

For comparison, an Al film to be converted to an insulating layer 5a having a thickness of 1.3 nm was deposited on an upper pinned layer 4c, and an intermediate layer 5 was formed by formation of the insulating layer 5a by an oxidizing treatment and formation of conductive columns 5b by irradiation of ion beam. Next, a free layer 7 was deposited on the intermediate layer 5 without forming an Al metal layer 6. After completion of the deposition, a heat treatment at 380° C. for 1 hour was conducted. Except that, a magnetoresistive element (Comparative Example) was produced in a similar manner to that of Example 1.

In the above-mentioned two methods, the total thicknesses of the deposited Al films were both 1.3 nm. Furthermore, the oxidation conditions were the same.

Figure 6:
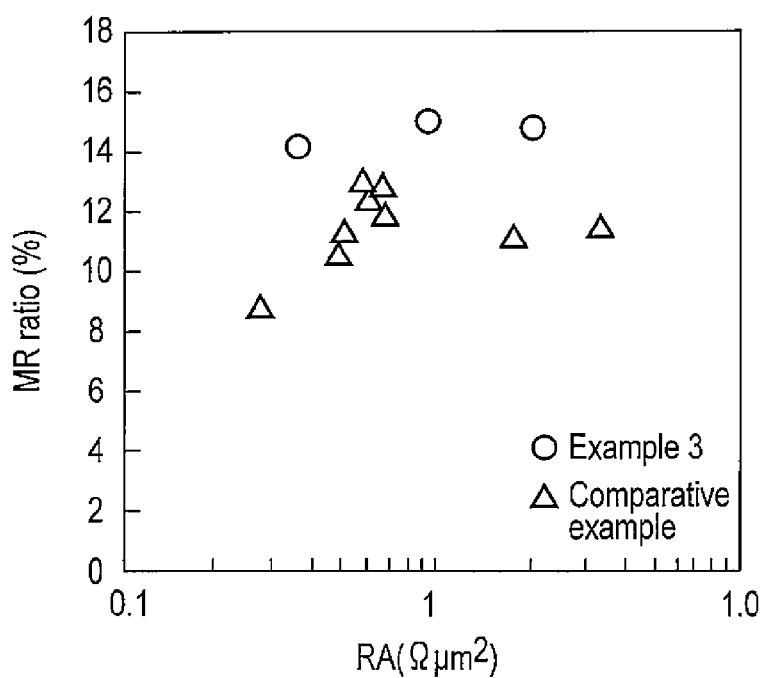
FIG. 6 is a graph showing the relationship between the resistance area product and MR ratio in Example 3.

FIG. 6 shows the relationship between the resistance area product RA and MR ratio of the resultant magnetoresistive element. As shown in FIG. 6, the magnetoresistive element manufactured by the method in which the Al metal layer 6 was deposited on the intermediate layer 5 has a higher MR ratio than that of the magnetoresistive element produced by the method in which the Al metal layer 6 was not deposited on the intermediate layer 5.

Furthermore, a similar result could be obtained also in the case where the metal layer 6 of at least one element other than Al was formed. The same applies to the cases where two or more types of metal layers 6 such as an Al/Cu stacked layer and an AlCu alloy layer were used.

[Magnetic Head Assembly and Magnetic Recording Apparatus]

Next, a magnetic head assembly and a magnetic recording apparatus (HDD) using the above-mentioned magnetoresistive element are described.

Figure 7:
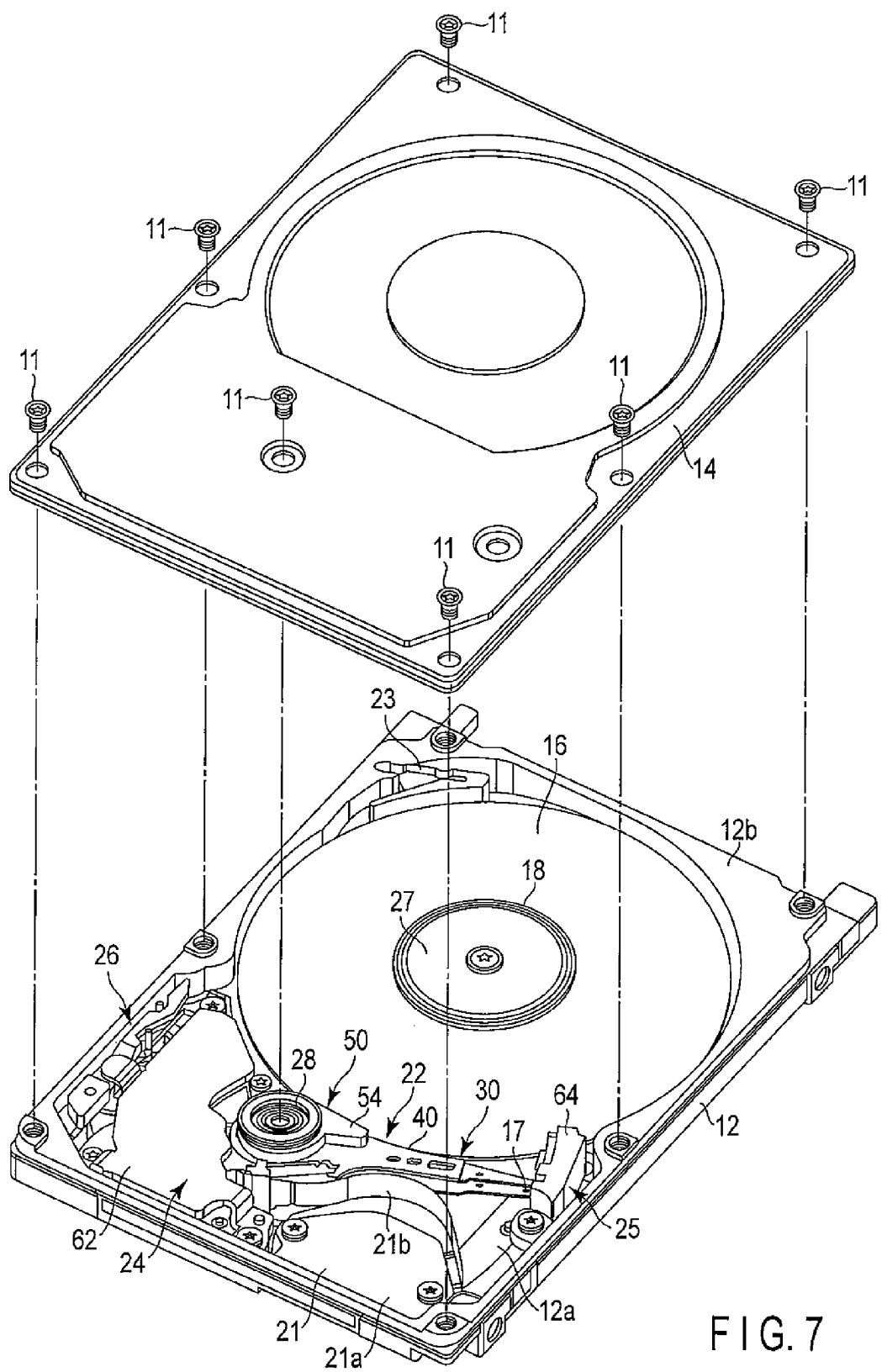
FIG. 7 is an exploded perspective view showing the HDD of an embodiment.

FIG. 7 is a perspective view showing the internal structure of an HDD with the top cover removed. As shown in FIG. 7, the HDD comprises a chassis. The chassis has a rectangular box-shaped base 12 having an opening on the upper surface, and a top cover 14 that is screwed on the base by a plurality of screws 11 to occlude the upper end opening of the base. The base 12 has a rectangular bottom wall 12a and a side wall 12b that is raised along the peripheral edge of the bottom wall.

In the chassis, a magnetic disk 16 as a recording medium and a spindle motor 18 as a driving unit for supporting and rotating the magnetic disk are disposed. The spindle motor 18 is disposed on the bottom wall 12a. In addition, the chassis is formed into a size that is capable of housing a plurality of, for example, two magnetic disks, and the spindle motor 18 is formed so that it can support and drive the two magnetic disks.

The chassis houses a plurality of magnetic heads 17 that read and write information from and to the magnetic disk 16, a head stack assembly (hereinafter referred to as HSA) 22 that movably supports these magnetic heads against the magnetic disk 16, a voice coil motor (hereinafter referred to as VCM) 24 that rotates and positions the HSA, a ramp loading mechanism 25 that retains the magnetic heads at a retract position that is apart from the magnetic disk when the magnetic heads transfer to the outermost periphery of the magnetic disk, a latch mechanism 26 that retains the HSA at a retract position when impact or the like acts on the HDD, and a substrate unit 21 having a preamplifier and the like. A printed circuit substrate that is not depicted is screwed on the outer surface of the bottom wall 12a of the base 12. The printed circuit substrate controls the motions of the spindle motor 18, VCM 24 and magnetic head through the substrate unit 21. A circulation filter 23 for capturing dusts that are generated in the chassis due to the operation of the movable units is disposed on the side wall of the base 12, and is positioned on the outer side of the magnetic disk 16.

The magnetic disk 16 is formed, for example, into a diameter of 65 mm (2.5 inches), and has magnetic recording layers on the top and bottom surfaces. The magnetic disk 16 is concentrically fit in a hub that is not depicted of the spindle motor 18 with each other, and is clamped by a clamp spring 27 and pinned on the hub. By doing so, the magnetic disk 16 is supported in a state that it is positioned in parallel to the bottom wall 12a of the base 12. The magnetic disk 16 is rotated by the spindle motor 18 at a rate of, for example, 5,400 rpm or 7,200 rpm.

Figure 9:
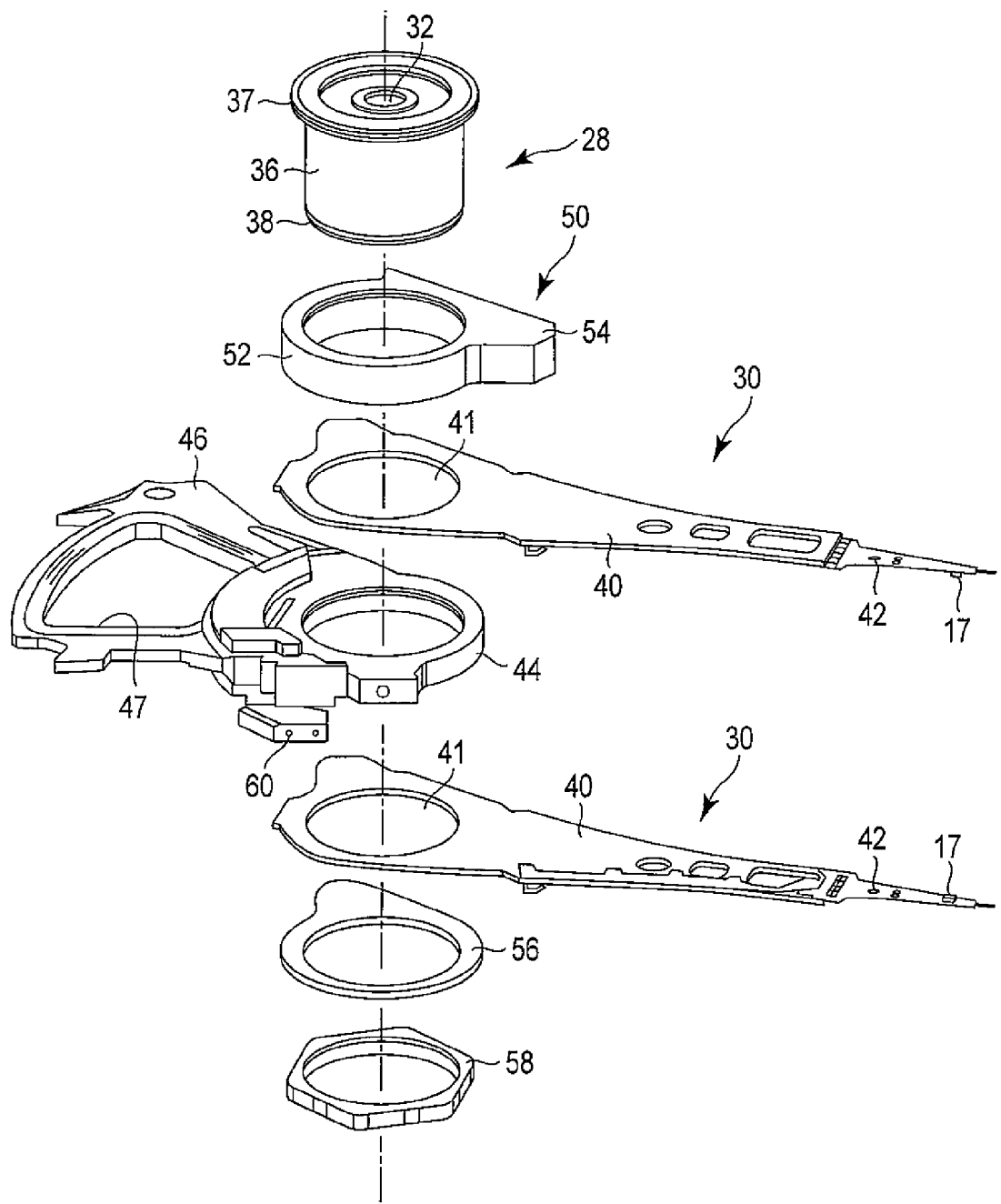
FIG. 9 is an exploded perspective view of the head stack assembly in FIG. 8.

FIG. 8 is a perspective view showing the head stack assembly (HSA) 22, and FIG. 9 is an exploded perspective view showing the disassembled HSA. As shown in FIGS. 8 and 9, the HSA 22 comprises a rotatable bearing unit 28, two head gimbal assemblies (hereinafter referred to as HGAs) 30 that are extending from the bearing unit, a spacer ring 44 that is disposed by stacking between the HGAs, and a dummy spacer 50.

The bearing unit 28 is positioned apart from the rotation center of the magnetic disk 16 along the longitudinal direction of the base 12, and is also disposed near the outer peripheral edge of the magnetic disk. The bearing unit 28 has a pivot 32 that is disposed in a standing manner on the bottom wall 12a of the base 12, and a cylindrical-shaped sleeve 36 that is supported rotatably by the pivot and concentrically with the pivot through a bearing 34. A ring-shaped flange 37 is formed on the upper end of the sleeve 36, and a screw section 38 is formed on the outer peripherary of the lower end part. In the sleeve 36 of the bearing unit 28, for example, four HGAs and spacers that are each positioned between the adjacent two HGAs at the maximum, are formed with sizes that allows attaching in a stacked state, in this case, with lengths in the axis direction that allows attaching.

In the present embodiment, since the magnetic disk 16 is set to one sheet, two HGAs 30 fewer than four, the maximum number to be attached, are disposed on the bearing unit 28. Each HGA has an arm 40 extending from the bearing unit 28, a suspension 42 extending from the arm, and a magnetic head 17 supported on the extended end of the suspension through a gimbal unit.

The arm 40 is formed into, for example, a flat plate shape by laminating stainless, aluminum and stainless, and a circular through-hole 41 is formed on one end thereof, i.e., a proximal end. The suspension 42 is constituted by an elongated leaf spring, and the proximal end thereof is fixed on the tip of the arm 40 by spot welding or adhesion and is extended from the arm. The suspension 42 and arm 40 may be formed integrally by using the same material.

The magnetic head 17 has an approximately rectangular slider that is not depicted, a write head formed on this slider, and a CPP-GMR read head, and is fixed on a gimbal unit formed on the tip end portion of the suspension 42. Furthermore, the magnetic head 17 has four electrodes that are not depicted. A relay flexible printed circuit board (hereinafter referred to as a relay FPC) that is not depicted is disposed on the arm 40 and suspension 42, and the magnetic head 17 is electrically connected to a main FPC 21b mentioned below through this relay FPC.

A spacer ring 44 is formed of aluminum or the like in desired thickness and outer diameter. A support flame 46 composed of a synthetic resin is formed integrally with the spacer ring 44 and is extending outward from the spacer ring. A voice coil 47 for the VCM 24 is fixed on this support flame 46.

The dummy spacer 50 has a ring-shaped spacer main body 52 and a balance adjusting unit 54 extending from the spacer main body, and is formed integrally with a metal such as stainless. The outer diameter of the spacer main body 52 is formed to be equal to the outer diameter of the spacer ring 44. Namely, the outer diameter of the part that contacts with the arm of the spacer main body 52 is formed to be the same as the outer diameter of the part at which the spacer ring 44 contacts with the arm. Furthermore, the thickness of the spacer main body 52 is formed into a thickness of the total of the thicknesses of the arms of the HGAs of a number that is smaller than the maximum number of the HGAs, which is two HGAs here, i.e., the sum of the thicknesses of the two arms and the thickness of the spacer ring that is disposed between these arms.

The dummy spacer 50, the two HGAs 30 and the spacer ring 44 are fit in the outer peripherary of the sleeve in a state that the sleeve 36 of the bearing unit 28 is inserted through the inner hole of the spacer main body 52, the through-hole 41 of the arm 40 and the inner hole of the spacer ring, and are disposed by stacking on the flange 37 along the axial direction of the sleeve. The spacer main body 52 of the dummy spacer 50 is in a state that it is sandwiched between the flange 37 and one of the arms 40, and the spacer ring 44 is in a state that it is sandwiched between the two arms 40, respectively, and the spacer main body 52 and the spacer ring 44 are fitted in the outer peripherary of the sleeve 36. Furthermore, a ring-shaped washer 56 is fitted in the outer peripherary of the lower end portion of the sleeve 36.

The dummy spacer 50, two arms 40, spacer ring 44 and washer 56 that are fitted in the outer peripherary of the sleeve 36 are sandwiched between a nut 58 that is threadably mounted on a screw unit 38 of the sleeve 36 and the flange 37, and are retained by fixing on the outer peripherary of the sleeve.

The two arms 40 are positioned with each other against the circumferential direction of the sleeve 36, and are extending from the sleeve in the same direction. Therefore, the two HGAs can be moved integrally with the sleeve 36, and face in parallel to each other to either surface of the magnetic disk 16 with an interval. Furthermore, the support flame 46 that is integrated with the spacer ring 44 is extending from the bearing unit 28 in the direction opposite to the arm 40. Pin-shaped two terminals 60 are extruding from the support flame 46, and these terminals are electrically connected to the voice coil 47 through a wiring that is embedded in the support flame 46 (not depicted).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element, comprising:
   a first ferromagnetic layer a magnetization direction of which is pinned;
   a second ferromagnetic layer a magnetization direction of which is changed depending on an external magnetic field;
   an intermediate layer arranged between the first ferromagnetic layer and the second ferromagnetic layer and comprising an insulating layer and a magnetic conductive column,
   an alloy layer formed between the magnetic conductive column in the intermediate layer and the second ferromagnetic layer and comprising at least one of FeCoAl and FeCoAlCu, and
   a pair of electrodes configured to supply a current perpendicularly to a film plane of a stacked film comprising the first ferromagnetic layer, the intermediate layer, the alloy layer and the second ferromagnetic layer.

2. The magnetoresistive element according to claim 1, wherein the alloy layer formed between the magnetic conductive column in the intermediate layer and the first ferromagnetic layer.

3. The magnetoresistive element according to claim 1, wherein the first ferromagnetic layer, the magnetic conductive column in the intermediate layer and the second ferromagnetic layer comprise at least one element selected from the group consisting of Fe, Ni and Co.

4. The magnetoresistive element according to claim 1, wherein the insulating layer in the intermediate layer comprises at least one element selected from the group consisting of oxygen, nitrogen and carbon.

5. The magnetoresistive element according to claim 3, wherein the insulating layer in the intermediate layer comprises an Al oxide.

6. The magnetoresistive element according to claim 1, wherein the alloy layer further comprises at least one element selected from the group consisting of Cr, V, Ta, Nb, Sc, Ti, Mn, Zn, Ga, Ge, Zr, Y, Tc, Re, B, In, C, Si, Sn, Ca, Sr, Ba, Au, Ag, Pd, Pt, Ir, Rh, Ru, Os, and Hf.

7. A magnetic head assembly comprising the magnetoresistive element according to claim 1.

8. A magnetic recording apparatus comprising the magnetic head assembly according to claim 7.

9. A method of manufacturing the magnetoresistive element according to claim 1 comprising:
    forming a first metal layer on a first ferromagnetic layer;
    performing a treatment to convert the first metal layer to an intermediate layer comprising an insulating layer and a magnetic conductive column;
    forming a second metal layer comprising at least one element selected from the group consisting of Al and Cu on the intermediate layer;
    forming a second ferromagnetic layer on the second metal layer; and
    causing diffusion of atoms by a heat treatment to convert the second metal layer to an alloy layer comprising at least one element selected from the group consisting of Al and Cu.

* * * * *